(12) United States Patent
Suzuki

(10) Patent No.: US 6,590,270 B2
(45) Date of Patent: Jul. 8, 2003

(54) SOLID-STATE PICKUP ELEMENT AND METHOD FOR PRODUCING THE SAME

(75) Inventor: Ryoji Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/838,095

(22) Filed: Apr. 19, 2001

(65) Prior Publication Data

US 2002/0005471 A1 Jan. 17, 2002

(30) Foreign Application Priority Data

Apr. 21, 2000 (JP) ........................................ 2000-120742

(51) Int. Cl.⁷ ...................... H01L 31/0232; H01L 21/00
(52) U.S. Cl. ......................... 257/436; 257/432; 438/75
(58) Field of Search .................................. 257/432, 436, 257/294; 438/69, 70, 71, 72, 75; 358/511; 385/36

*Primary Examiner*—Tom Thomas
*Assistant Examiner*—Samuel A Gebremariam
(74) *Attorney, Agent, or Firm*—Robert J. Depke; Holland & Knight LLC

(57) ABSTRACT

The invention relates to a color solid-state pickup element and a method for producing the same, which can improve the sensitivity by efficiently utilizing light received by the element surface and has an excellent color reappearance property, wherein, in a solid-state pickup element having light receptive elements arrayed and formed on the surface side of a substrate, a light polarizing prism that polarizes light he that has entered from the surface side of the substrate, distributes and irradiates spectral light ha of specified wavelength bands onto a plurality of light receptive areas is provided on the substrate in which the light receptive areas are arrayed and formed; the second light condensing lens that condenses light he irradiated on the surface side of the substrate is provided on the light polarizing prism; an in-layer lens that makes the light hc condensed by the second light condensing lens into a parallel beam hb and causes it to enter the light polarizing prism is provided between the second light condensing lens and the light polarizing prism; and further the first light condensing lens that condenses the respective spectral light ha polarized by the light polarizing prism onto the light receptive areas is provided between the respective light receptive area a and the light polarizing prism.

4 Claims, 3 Drawing Sheets

SOLID-STATE PICKUP ELEMENT AND METHOD FOR PRODUCING THE SAME

RELATED APPLICATION DATA

The present application claims priority to Japanese Application No. P2000-120742 filed Apr. 21, 2000, which application is incorporated herein by reference to the extent permitted by law.

BACKGROUND OF THE INVENTION

The present invention relates to a solid-state pickup element that is capable of picking up color images, and a method for producing the same.

A solid-state pickup element that is capable of picking up color images obtains the respective colors of signals by providing color filters on light receptive areas. Such a solid-state pickup element is constructed so that light receptive areas are formed at the central parts of respective pixels arrayed on the surface side of, for example, a substrate, and respective color filters B, G and R, which are colored, for example, B(Blue), G(Green) and R(Red), are arrayed and formed on these light receptive areas one after another. Also, a light condensing lens (a so-called on-chip lens) is provided on the respective color filters B, G and R, by which incident light is condensed on the light receptive plane of the light receptive areas, whereby light can be efficiently condensed.

In a solid-state pickup element that has thus been constructed, only the light condensed by the light condensing lens of the light of respective wavelength bands that has transmitted through the respective color filters B, G and R arrayed between the light condensing lens and the light receptive areas will reach the light receptive plane of the respective light receptive areas, wherein full-color pickup can be carried out.

However, since, in such a solid-state pickup element that has thus been constructed, only the light of specified wavelength bands is selected by the respective color filters and is received by the light receptive areas, the light other than one with the specified wavelength band corresponding to the light receptive areas is not utilized in the respective light receptive areas even if it is the light of other specified wavelength bands necessary to obtain a color image. Therefore, the light received by the element surface is not sufficiently utilized, and it cannot be said that improvement in the sensitivity has been sufficiently attained.

Also, in the production of a color solid-state pickup element using respective color filters, it is difficult to form color filters by which light of an optional wavelength band can be separated and transmitted. Therefore, it is difficult to obtain the sufficient reappearance of colors.

Therefore, it is an object of the present invention to provide a color solid-state pickup element that is capable of achieving improvement in the sensitivity by efficiently utilizing the light received by the element surface and has an excellent color reappearance property, and a method for producing the same.

SUMMARY OF THE INVENTION

In order to achieve the object, a solid-state pickup element according to the invention is featured in that, in a plurality of light receptive areas arrayed and formed on the surface side of a substrate, a light polarizing prism that polarizes light incident from the surface side of the abovementioned substrate, and distributes to irradiate spectral light of a specified wavelength band onto the abovementioned respective light receptive areas is provided on the abovementioned substrate.

In such a solid-state pickup element thus constructed, spectral light of a specified wavelength band, which is polarized by a light polarizing prism is distributed and irradiated onto respective light receptive areas. Therefore, all light, of a specified wavelength band necessary to carry out color pickup, of the light received by the light polarizing prism will be irradiated onto any one of the respective light receptive areas, wherein color pickup efficiently using the received light can be carried out.

The first light condensing lens that condenses spectral light of the abovementioned specified wavelength band, which is polarized by the corresponding light polarizing prism, onto the corresponding light receptive areas is provided between the abovementioned respective light receptive areas and the abovementioned light polarizing prism, wherein spectral light of respective specified wavelength bands, which is polarized by the light polarizing prism, can be efficiently condensed on the respective light receptive areas, and the efficiency of the utilization of the spectral light can be highly increased.

The second light condensing lens that condenses light incident into the surface side of the abovementioned substrate is provided on the abovementioned light polarizing prism, and an in-layer lens that makes light condensed by the second condensing lens into a parallel beam and makes the same incident into the corresponding light polarizing prism is provided between the second light condensing lens and the abovementioned light polarizing prism, wherein the light can be efficiently condensed on the surface side of the substrate, and is made incident into the light polarizing prism as a parallel beam, and the efficiency of the utilization of the received light at the surface side of the substrate can be highly increased.

Light polarized by the abovementioned light polarizing prism is distributed and irradiated to at least three light receptive areas, wherein full-color pickup efficiently using the received light can be carried out.

A method for producing a solid-state pickup element includes the step of forming a convex pattern made of a prism material on a substrate in which light receptive areas are arrayed and formed on the surface side thereof, and the step of forming a prism material layer by a biased CVD method, which covers the abovementioned convex pattern, and forming a light polarizing prism consisting of the abovementioned convex pattern and the abovementioned prism material layer.

By such a method for producing a solid-state pick element, since a prism material layer that covers a convex pattern on the substrate is formed by the bias CVD method, a prism material layer having an inclined surface with respect to the substrate can be formed. Therefore, the surface of the prism material layer inclined with respect to the substrate is made into an incident surface, wherein a light polarizing prism, in which the prism material layer and the bottom plane of the convex pattern are made into an irradiation plane, can be formed on the substrate.

As described above, according to the solid-state pickup element of the invention, since a light polarizing prism is provided on the substrate in which light receptive areas are arrayed, all light, of specified wavelength bands necessary to carry out color pickup, of the light received by the light polarizing prism will be able to be irradiated onto any one of the respective light receptive areas, and color pickup efficiently using the received light can be executed. As a result, it becomes possible to a color solid-state pickup apparatus which has excellent sensitivity. Furthermore, since the light polarizing prism is used, it is possible to receive spectral light of optical wavelength bands by the respective light receptive areas, and it is possible to improve the color reappearance property of solid-state pickup elements.

Also, according to the method for producing a solid-state pickup element of the invention, since a prism material layer that is made of a prism material and covers the convex patterns is formed by the bias CVD method, it becomes possible to easily form a light polarizing prism on a substrate. Therefore, the process for producing a color solid-state pickup element equipped a on-chip light polarizing prism can be simplified.

DETAILED DESCRIPTION OF THE PREFERRED EMBODIMENTS

Hereinafter, a description is given of one embodiment according to the invention with reference to the accompanying drawing. Herein, a solid-state pick element, according to the invention, which can be obtained by a method for producing a solid-state pickup element, is described prior to the description of the method for producing a solid-state pickup element according to the invention.

Figure 1A:
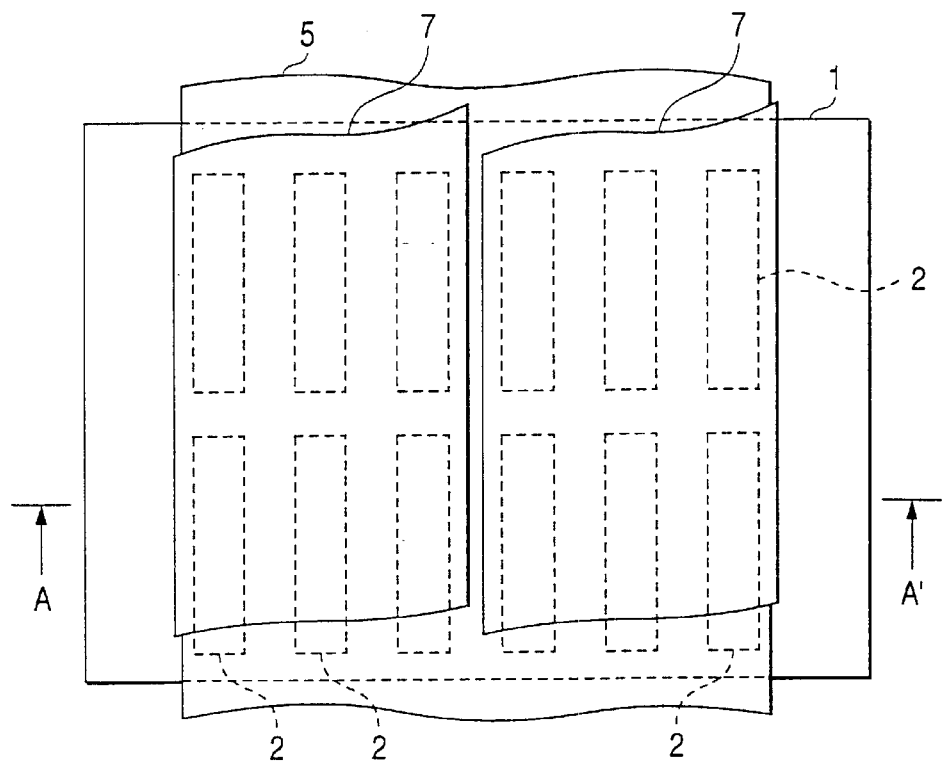
FIG. 1 shows a plan view and a cross-sectional view that describe one embodiment of a solid-state pickup element according to the invention.
Figure 1B:
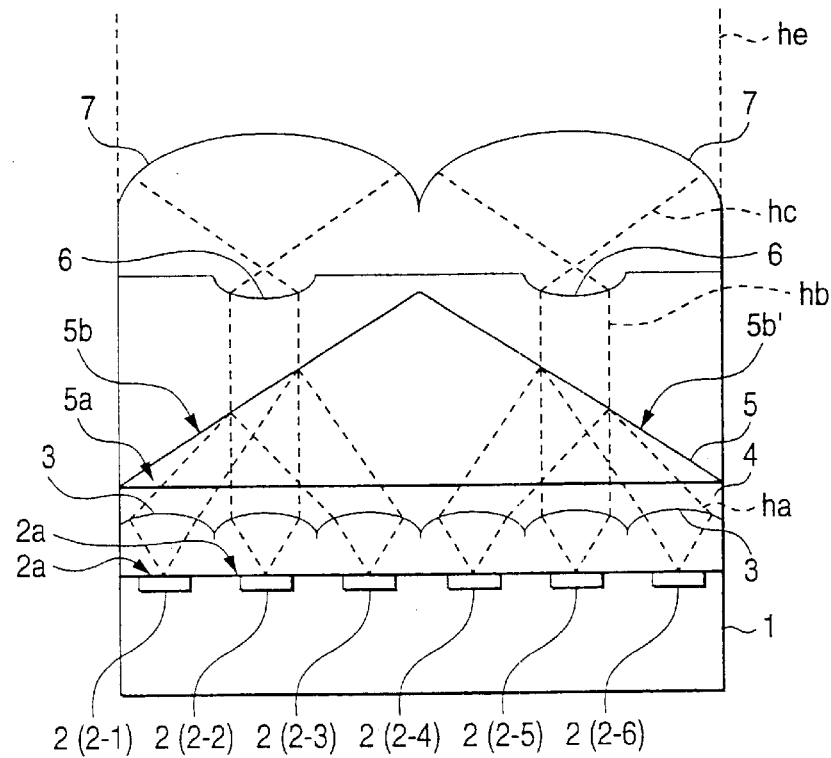

FIG. 1A is a plan view of a solid-state pickup element according to one embodiment of the invention, and FIG. 1B is a cross-sectional view taken along the line A–A' in FIG. 1A.

The solid-state pickup element shown in the drawings has a plurality of light receptive areas 2 consisting of a photo diode arrayed like a matrix and formed on the surface side of the substrate 1. Also, in the drawings, the left and right directions are made into line directions while the up and down directions in the plan view and the depth direction in the cross-sectional view are made into row directions.

The first light condensing lens 3 (shown in only the cross-sectional view) is provided on the respective light receptive areas 2. The respective first light condensing lenses 3 are made convex at the central part thereof. The curvature of the lenses and the distance from the light receptive plane 2a are established so that light condensed by the first light condensing lenses 3 are made incident onto the light receptive plane 2a of the light receptive areas 2. The first light condensing lenses 3 may be individually provided at the respective light receptive areas 2, or may have continuous shapes in the row direction or line direction, or may be provided row by row in the light receptive areas 2 or line by line in the light receptive areas 2.

A flattening film 4 (shown in only the cross-sectional view) consisting of a transparent material, the refractive index of which is lower than that of a transparent material that constitutes the first light condensing lenses 3, is provided on the corresponding first light condensing lenses 3. For example, it is assumed that, in the case where the first light condensing lenses 3 are made of nitrogen silicon, the flattening film 4, which is composed of a transparent resin material having a lower refractive index than that of nitrogen silicon, has been constructed.

And, a plurality of light polarizing prisms 5 (only one light polarizing prism is shown in the drawing) are provided on the flattening film 4. The light polarizing prism 5 is shaped to be like a triangular prism whose cross section is, for example, an isosceles triangle, and in the state where the plane composed on the bottom of the corresponding isosceles triangle is made into a boundary phase 5a with the flattening film 4, the light polarizing prism 4 extends in the row direction (the up and down directions in the plan view) of the respective light receptive areas 2. And, for example, it is assumed that a light polarizing prism 5 is provided for each of the light receptive areas 2 equivalent to six rows, which are arrayed in the line direction, and the respective light polarizing prisms 5 are commonly shared by the light receptive areas 2 for six rows.

In particular, it is assumed that an interval between the light polarizing prism 5 and the first light condensing lens 3 is maintained so that spectral light ha (shown in only the cross-sectional view), of respective specified wavelength bands necessary to carry out full color pickup of the light polarized by the light polarizing prism 5, is made incident into the respective first light condensing lenses 3 on the light receptive areas 2 for six rows.

In detail, the spectral light ha that is incident from one upper plane 5b of the light polarizing prism 5 and is discharged from the boundary phase 5a of the flattening film 4 is made incident into the respective first light condensing lenses 3 on the light receptive areas (2-1) through (2-3) on the first through third rows, and the spectral light ha that is incident from the other upper plane 5b' of the light polarizing prism 5 and is discharged from the boundary phase 5a is made incident into the respective first light condensing lenses 3 on the light receptive areas (2-4) through (2-6) on the fourth through sixth rows.

Also, the drawing shows that all light polarized by the light polarizing prism 5 is irradiated on the first light condensing lens 3. However, it is assumed that the first light condensing lens 3 is provided so that the spectral light ha, of respective specified wavelength bands necessary to carry out full color pickup of the light polarized by the light polarizing prism 5 as described above, is irradiated onto the first light condensing lenses 3 on the light receptive areas 2 for six rows. For example, it is constructed such that the respective beams of the spectral light ha of a blue band, a green band and a red band in the order of wavelength band are distributed to and irradiated on the respective light condensing lenses 3 on the respective light receptive areas (2-1) through (2-3) and (2-4) through (2-6).

The light polarizing prism 5 is composed of a transparent material whose refractive index differs from that of the flattening film 4, for example, oxidation silicon.

An in-layer lens 6 (shown in only the cross-sectional drawing) that makes light incident into the corresponding light polarizing prism 5 into a parallel beam hb is provided on the light polarizing prism 5. For example, the in-layer lens 6 and its central part are made into a concave lens whose central part is oriented toward the light polarizing prism 5 side. The in-layer lens 6 is provided by one in the light receptive areas 2 for two rows, that is, on the respective upper surfaces 5b and 5b' of the respective light polarizing prisms 5, respectively. The parallel beam hb having passed through the respective in-layer lenses 6 are provided so as to enter the respective light polarizing prisms 5b and 5b'.

In detail, the parallel beam hc that has passed through the in-layer lens 6 of the first row (the left side in the drawing) is caused to enter one upper surface 5b of the light polarizing prism 5, and the parallel beam hc that has passed through the in-layer lens 6 of the second row (the right side in the drawing) is caused to enter the other upper surface 5b' of the light polarizing prism 5.

Further, the second light condensing lens (so-called on-chip lens) 7 is provided on the in-layer lens 6. The second light condensing lens 7 is made convex at its central part, and is provided on the in-layer lenses 6, respectively. And, the curvature of the lens and distance to the in-layer lenses 6 are established so that the light hc that has been condensed by the second light condensing lenses 6 is caused to enter the respective in-layer lenses 6 downward thereof.

Herein, the second light condensing lens 7 is constructed of, for example, a transparent material whose refractive index is larger than that of the transparent material that constitutes the in-layer lens 6, and the curvature of the second light condensing lens 7 and distance to the in-layer lens 6 are established so that the light, which has been condensed by the respective second light condensing lenses 7, is caused to enter the respective in-layer lenses 6 after having passed through the focal point of the corresponding second light condensing lens 7.

The respective second light condensing lenses 7 may be shaped so that they are continuous in the row direction of the light receptive areas 2 as shown in the drawing, or may be constructed so that they are provided per line with the light receptive areas 2 of three rows collected as one. However, the surface side of the substrate 1 are covered by the second light condensing lenses 7 without any waste.

In a solid-state pickup element thus constructed, light is caused to enter the respective light receptive areas 2 as shown below. First, the received light he that was irradiated from the surface side of the substrate 1 to the solid-state pickup element is condensed by the respective second light condensing lenses 7. The light hc that has been condensed by the second light condensing lenses 7 becomes a parallel beam hb by passing through the in-layer lens 6 and is caused to enter the upper surfaces 5b and 5b' of the light polarizing prism 5. And, respective parallel beams hb that have entered the light polarizing prism 5 are polarized in the order of wavelength by passing through the light polarizing prism 5. Spectral light ha of a specified wavelength band is caused to enter respective first light condensing lenses 3 on the light receptive areas (2-1) through (2-3) of the first through third rows and respective first light condensing lenses 3 on the light receptive areas (2-4) through (2-6) of the fourth through sixth rows, wherein the light is condensed by the respective light condensing lenses 3 and is caused to enter the respective light receptive areas 2.

Therefore, spectral light ha of respective specified wavelength bands necessary to carry out full color pickup will be irradiated onto the light receptive plane 2a of the respective light receptive areas 2.

As described above, in the solid-state pick up element thus constructed, the spectral light ha of specified wavelength bands, which is polarized by the light polarizing prism 5, is distributed and irradiated on the respective light receptive areas 2 of three rows. Therefore, all the spectral light ha, of specified wavelength bands necessary to color pickup, of the light he that has been received by the surface side of the substrate 1 is irradiated onto any one of the respective light receptive areas 2, and it becomes possible to efficiently carry out full color pickup, using the received light he. As a result, it is possible to improve the sensitivity of the solid-state pickup element of single-plate full-color.

In addition, since the first light-condensing lens 3 is provided between the respective light receptive areas 2 and the light polarizing prism 5, the spectral light ha of respective specified wavelength bands is efficiently condensed on the respective light receptive areas 2 by the light polarizing prism 5, wherein it is possible to improve the ratio of the utilization of respective spectral light ha.

The second light condensing lens 7 that condenses the received light he, which has entered from the surface side of the substrate 1, is provided on the light polarizing prism 5, and the in-layer lens 6 for making light hc condensed by the light condensing lens 7 into a parallel beam hb is provided between the second light condensing lens 7 and the light polarizing prism 5, wherein the received light he at the surface side of the substrate 1 can be efficiently condensed and made into a parallel beam hb, and is caused to enter the light polarizing prism 5. Therefore, the ratio of the utilization of the received light he can be greatly increased at the surface side of the substrate 1.

Also, since the received light he is polarized by the light polarizing prism 5, it becomes possible to receive only the spectral light of optional specified wavelength bands at appointed light receptive areas 2. Therefore, it is possible to improve the color reappearance property of the solid-state pickup element.

In addition, in the solid-state pickup element constructed as described above, the solid-state pickup element is constructed so that the spectral light ha by the respective light polarizing prisms 5 are distributed to and irradiated onto the light receptive areas for three rows. However, the solid-state pickup element according to the invention is not limited to this. But, such a construction may be employed, in which the spectral light ha by the respective light polarizing prisms 5 are distributed to and irradiated onto a plurality of light receptive areas 2 for four or more rows. Also, in the case where such a construction is employed, in which the spectral light ha by the respective light polarizing prisms 5 are distributed to and irradiated onto the light receptive areas 2 for two rows, it is possible to obtain a solid-state pickup element by which multi-color pickup can be carried out.

Next, a description is given of a method for producing a solid-state pickup element that is constructed as described above, on the basis of FIG. 2 and FIG. 3.

Figure 2A:
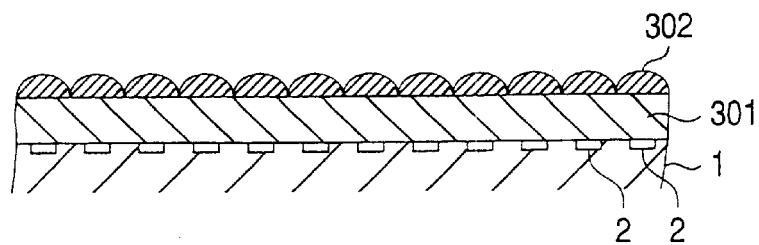
FIG. 2 shows cross-sectional process charts (part 1) that describe a method for producing a solid-state pickup element according to the invention.

First, as shown in FIG. 2A, a lens-forming layer 301 that forms the first light condensing lens is formed on a substrate 1 on the surface side of which a plurality of light receptive areas 2 are arrayed and formed. It is assumed that the lens forming layer 301 is made of a transparent material such as, for example, nitrogen silicon film. Next, a resist pattern is formed on the lens forming layer 301 by using a lithography technique. The resist pattern may be individually formed on the respective light receptive areas 2. Next, the resist pattern is softened and melted by thermal treatment, whereby it is formed to be a convex resist pattern 302, the central part of which is higher than the other part, by the surface tension.

Figure 2B:
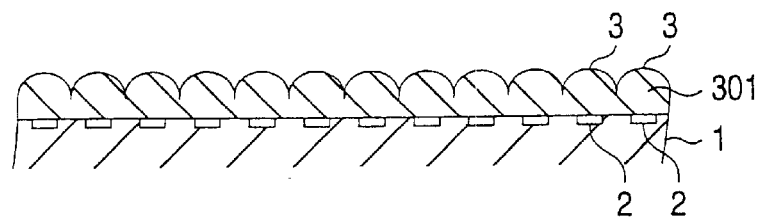

Next, as shown in FIG. 2B, the convex resist pattern (302) is used as a mask, and an etching agent whose etching rate is almost the same with respect to the resist pattern (302) and lens forming layer 301 is used to etch the resist pattern (302) and the lens forming layer 301. Then, since the lens forming layer 301 is etched in compliance with the shape of the resist patterns (302), the lens forming layer 301 is made convex similar to the convex shape of the resist pattern (302), wherein the first light condensing lens 3 is formed on the respective light receptive areas 2.

Figure 2C:
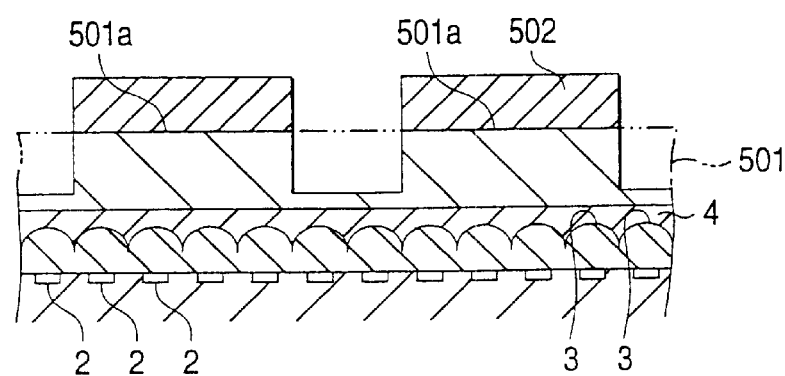

After that, as shown in FIG. 2C, a flattening film 4 made of a transparent material whose refractive index is different from that of the first light condensing lens 3 is formed in a state where it can covers the first light condensing lens 3. The flattening film 4 is made of, for example, a resin material. Next, a prism material layer 501 made of a transparent material that differs from the corresponding flattening film 4, is formed on the flattening film 4. The prism material layer 501 is made of, for example, oxidation silicon.

Next, a resist pattern 502 is formed on the prism material layer 501 by the lithography technique, and the prism material layer 501 is anisotropically etched to an appointed depth with the resist pattern 502 used as a mask, thereby forming convex patterns 501a made of the prism material. The convex patterns 501a are repeatedly formed twice every six-row light receptive areas 2, and are caused to extend in the row direction of the light receptive areas 2. Also, after the anisotropic etching is completed, the resist pattern 502 is removed.

Figure 2D:
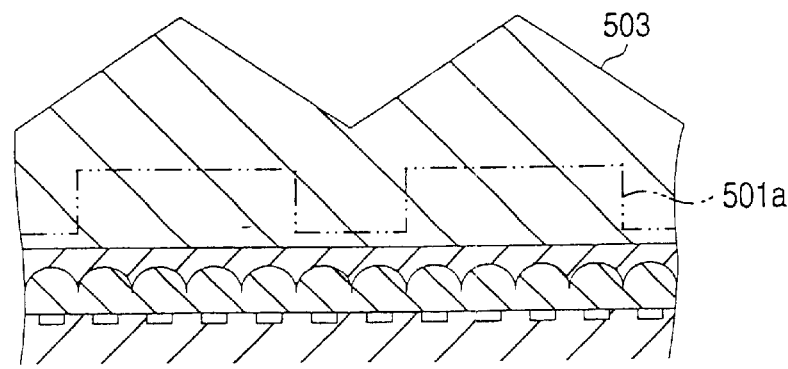

Next, as shown in FIG. 2D, a prism material layer 503 made of the same material (that is, herein oxidation silicon) as that of the prism material layer that constitutes the convex patterns 501a is formed so as to cover the convex pattern 501a. Herein, in particular, the prism material layer 503 is formed by a bias CVD method such as ECR (Electron Cyclotron Resonance)-CVD (Chemical Vapor Deposition) method and ICP (Inductive Coupled Plasma)-CVD method, etc., thereby forming a prism material layer 503 having an inclined surface with respect to the substrate 1.

Next, as shown in FIG. 3(1), the prism material layer 503 is etched from its surface side, whereby a light polarizing prism 5 made of an oxidation silicon is formed. At this time, the distance between the first light condensing lens 3 and the light polarizing prism 5 can be optimized by adjusting the amount of etching.

Figure 3A:
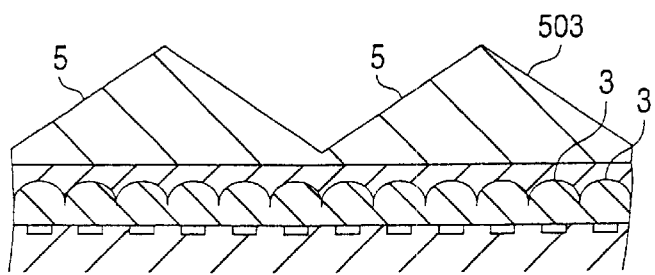
FIG. 3 shows cross-sectional process charts (part 2) that describe a method for producing a solid-state pickup element according to the invention.
Figure 3B:
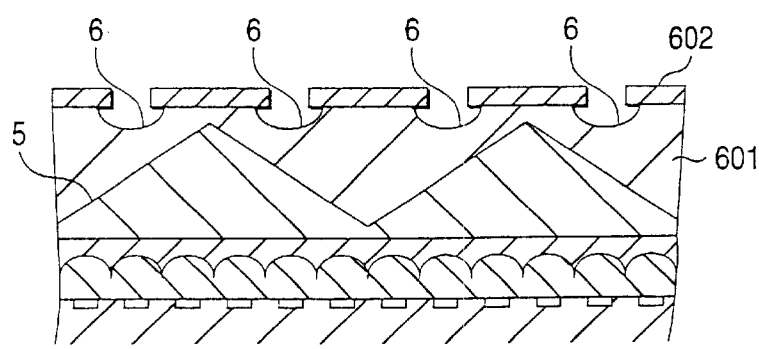

In addition, as shown in FIG. 3B, a lens forming layer 601 made of a transparent material whose refractive index is different from that of the light polarizing prism 5, and the surface thereof is flattened. After that, a resist pattern 602 having an open part 602a along the portion corresponding to both the sides of a ridge line of the light polarizing prism 5 is formed on the lens forming layer 601. Next, the lens forming layer 601 is isotropically etched with the resist pattern 602 used as a mask, whereby a concave part is formed at the lens forming layer 601, and the concave part is used as an in-layer lens 6. After the isotropic etching is completed, the resist pattern 602 is removed.

Figure 3C:
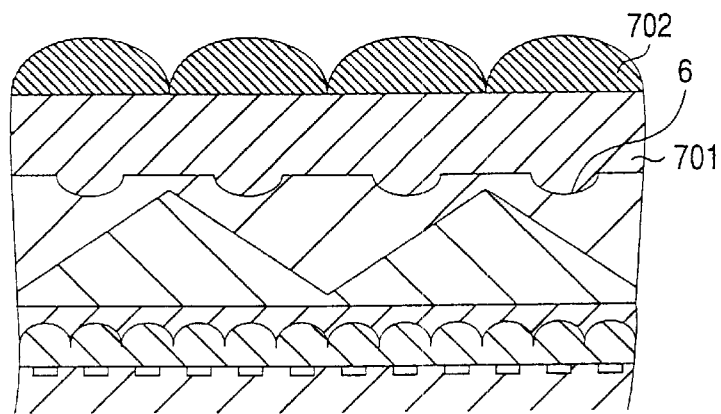
Figure 3D:
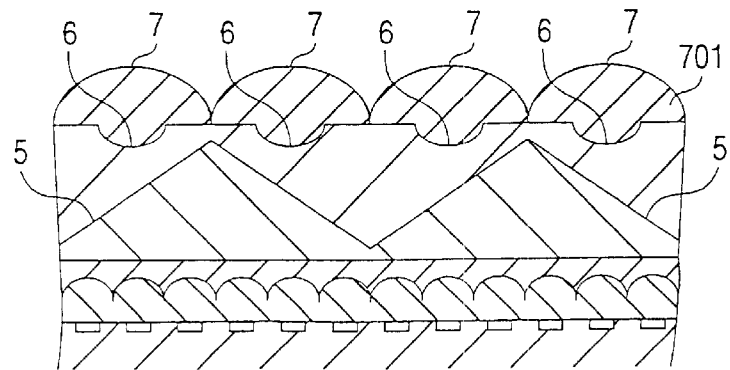

Next, as shown in FIG. 3C, a lens forming layer 701 made of a transparent material having a higher refractive index than that of the lens material layer 601 is formed so as to fill up the concave parts of the in-layer lenses 6, and the surface thereof is flattened. After that, by carrying out the steps shown in FIG. 3C and FIG. 3D as in the description using FIG. 2A and FIG. 2B, a convex resist pattern 702 having the central part, which is higher than the other part, is formed on the lens forming layer 701. Using this as a mask, the lens forming layer 701 is etched to form the second light condensing lens 7.

According to such a producing method, as has been described with reference to FIG. 2D, since a prism material layer 503 that covers the convex pattern 501a is formed by using the bias CVD method, the prism material layer 503 having an inclined surface with respect to the substrate 1 can be formed. Therefore, it is possible to easily form a light polarizing prism 5 in which the surface of the prism material layer 503, which is inclined with respect to the substrate 1, is used as an incident plane, and the bottom surfaces of the prism material layer 503 and pattern 501a are used as an irradiation plane. Therefore, it is possible to easily produce a solid-state pickup element equipped with an on-chip light polarizing prism 5.

What is claimed is:

1. A solid-state pickup element having a plurality of light receptive areas arrayed and formed on the surface side of a substrate, wherein a light polarizing prism that polarizes light incident from the surface side of said substrate, and distributes to irradiate spectral light of a specified wavelength band onto said respective light receptive areas is provided on said substrate.

2. The solid-state pickup element according to claim 1, wherein a first light condensing lens that condenses spectral light of said specified wavelength band, which is polarized by the corresponding light polarizing prism, onto the corresponding light receptive areas is provided between said respective light receptive areas and said light polarizing prism.

3. The solid-state pickup element according to claim 1, wherein a second light condensing lens that condenses light incident into the surface side of said substrate is provided on said light polarizing prism, and an in-layer lens that makes light condensed by the corresponding condensing lens into a parallel beam and makes the same incident into the corresponding light polarizing prism is provided between said light condensing lens and said light polarizing prism.

4. The solid-state pickup element according to claim 1, wherein light polarized by said light polarizing prism is distributed and irradiated to at least three light receptive areas.

* * * * *